July 30, 1968 J. P. PRITCHARD, JR., ET AL 3,395,040

PROCESS FOR FABRICATING CRYOGENIC DEVICES

Filed Jan. 6, 1965 3 Sheets-Sheet 1

July 30, 1968 J. P. PRITCHARD, JR., ET AL 3,395,040

PROCESS FOR FABRICATING CRYOGENIC DEVICES

Filed Jan. 6, 1965 3 Sheets-Sheet 2

United States Patent Office 3,395,040

Patented July 30, 1968

3,395,040

PROCESS FOR FABRICATING CRYOGENIC DEVICES

John P. Pritchard, Jr., and Buford G. Slay, Jr., Richardson, and Thomas M. Francis, Plano, Tex., assignors to Texas Instruments Incorporated, Dallas, Tex., a corporation of Delaware Filed Jan. 6, 1965, Ser. No. 423,734
4 Claims. (Cl. 117—212)

ABSTRACT OF THE DISCLOSURE

A process is disclosed by which to construct cryogenic devices by electrolessly substituting in areas to be used as gates either tin (Sn) for a lead (Pb) device strip, lead (Pb) for a copper (Cu) device strip or tin (Sn) for a copper (Cu) device strip.

The present invention relates generally to thin film circuits, and more particularly relates to a process for fabricating cryogenic devices such as memory arrays employing cryotrons.

In general, cryogenic circuits may be considered as those circuits which are operated at such low temperatures that metal becomes superconductive and exhibits no resistance until the current exceeds a critical limit for the particular temperature, at which time the metal abruptly reverts to normal resistivity. Different metals have different critical current levels for a particular temperature and for a particular magnetic field strength in which the metal is positioned. A cryotron utilizes this phenomenon to provide a means for switching a particular carrier conductor from superconductivity to normal resistivity.

A cryotron is formed by positioning a control conductor formed from a metal having a relatively high critical current at the particular operating temperature, such as lead, in close proximity to a carrier conductor having a gate formed of a different metal, such as tin, having a relatively low critical current at the operating temperature. A current in the control conductor below the critical level for the control conductor will nevertheless create a magnetic field adjacent the gate sufficient to switch the gate from superconductivity to normal resistivity so that a free cycling current, for example, in the carrier conductor containing the gate can be abruptly stopped.

In copending application Ser. No. 339,018, entitled "Process for Manufacturing Multilayer Film Circuits," filed Jan. 20, 1964, and assigned to the assignee of the present application, a process for manufacturing thin film circuits in general, and cryogenic circuits in particular, is described. In that process, cryotrons are fabricated by first forming gate strips of one type of metal, such as tin, on a substrate. The tin gate strips are covered with a layer of insulating material having windows over the ends of the tin strips. A lead film is deposited over the insulating material so as to pass through the windows and make contact with the previously deposited tin gate strips, and the lead film is then patterned to form the carrier conductor in which the tin gate strip is serially connected. A control conductor is also patterned from the lead film in a position over, but insulated from, the tin gate strip to complete the cryotron. In order for cryogenic circuits to be fabricated with high component densities, it is necessary to dispose each gate strip between the control conductor and a shadowing superconductive ground plane, which, for convenience, may also be fabricated from lead.

The above process is useful in the fabrication of cryogenic circuits, but has disadvantages in that surface contamination between successive tin and lead films which are joined together through the windows sometimes adversely affect the superconductivity of the joint, thereby reducing the device yield from the process. Also, the vertical column formations necessary to join successively deposited layers through the insulating films increase the complexity of the photomasks required, decrease the component density which can be attained, and in general produce more angular structures, thereby reducing the speed at which the system can be operated. Further, the process generally requires the use of a vacuum system for depositing both the lead and the tin films, and the vacuum system must include a suitable system for cleaning the surfaces of the metals while within the vacuum chamber, such as by ion bombardment.

Others have attempted to fabricate cryogenic circuits by means of a process wherein the various metal conductors and control gates, as well as insulating layers, are vapor deposited through mechanical stencils to produce the desired circuits on a substrate. Such stencil techniques require a relatively large number of masks having very fine slits through which the metal conducting paths can be deposited. This technique severely limits the reduction of component size and the component density due to the fact that the stencils must be sufficiently stiff to withstand handling and must be sufficiently stiff to be pressed tightly against the surface of the substrate so as to reduce leakage of the deposition metals under the stencil. Alignment of the stencils presents a problem of considerable magnitude because it must usually be done remotely in a vacuum chamber. Further, the stencil must resist warpage at the high temperatures required for vapor deposition of the metals. If the stencils are made sufficiently large and thick to satisfy the above condition, the thick stencils also present considerable shadow problems because the source of metal cannot be precisely perpendicular to the substrate at all points.

We have discovered a process for fabricating thin film cryogenic circuits in particular, and thin film circuits in general, which alleviates most of the problems mentioned above. Such a process is based broadly upon the discovery that thin film cryogenic circuits can be fabricated by chemically substituting one metal for a previously formed thin film of another metal. More specifically, we have discovered that tin can be substituted for preselected areas of a previously formed thin lead film, that lead can be substituted for preselected areas of a previously formed thin copper film, and that tin can be substituted for preselected areas of a previously formed thin copper film.

In general, most electroless plating processes result in the substitution of the plating metal for the plated metal for a thickness of several thousand angstroms. Since thin film circuits in general, and cryogenic circuits in particular, are fabricated from thin metal films of less than this thickness, a thin film of a first metal subjected to such an electroless plating solution is substantially replaced by the plating metal. Thus a metal film which is otherwise difficult to deposit, or difficult to make adherent to a particular substrate, may be formed by an electroless and vacuumless process, and will be superconductive and adherent. But more importantly, the metal film may be replaced in predetermined areas by the plating metal, and the junction between the two metals will be electrically coherent and superconductive.

Thus in accordance with a more specific aspect of the invention, the gated carrier conductor of a cryotron may be fabricated by first forming and patterning a thin lead film on a substrate by any suitable process, including the area ultimately to be occupied by a tin control gate. Next, a layer of photo-resist material is applied over the substrate and an aperture formed in the photo-resist extending transversely of the lead conductor in the area where the tin gate is desired. The substrate is then subjected to an electroless plating solution wherein tin is substituted for at least a major portion of the lead in the exposed area to form a tin gate connected in series and coplanar with the lead conductor. The junction between the tin and the adjacent lead film is superconductive and the gate may be switched resistive by a suitable current in a suitably disposed control conductor.

In accordance with another aspect of the invention, predetermined areas of a copper film may be similarly replaced by either lead or tin using a similar electroless chemical substitution process. Thus a thin copper film may first be deposited on the substrate by a suitable chemical or vapor deposition technique. Then the copper may be patterned by conventional photo-resist and etching techniques to form a conductor. Lead may then be substituted for the copper in its entirety, or only in the areas of the conductor which are ultimately to be lead. Then tin may be substituted for either the copper or the lead in the areas of the conductors which are to ultimately comprise the tin gate strips.

In accordance with a more specific aspect of the invention, tin may be substituted for a thin film of lead by exposing the lead to an acidic stannous solution, and more particularly, to an acidic stannous halide solution, such as a solution of dilute hydrochloric acid and stannous chloride, or dilute hydrochloric acid and stannous bromide.

In accordance with another aspect of the invention, lead may be substituted for a thin film of copper by subjecting the copper to a solution comprised of a soluble lead salt, a reducing agent and a solvent. More specifically, the solution may comprise thiourea and lead nitrate dissolved in dimethyl-sulfoxide.

In accordance with yet another aspect of this invention, tin may be substituted for a thin film of copper by exposing the copper to an acidic solution of a soluble stannous compound, and more specifically to a solution comprised of stannous chloride, thiourea, hydrochloric acid and water.

In accordance with another aspect of this invention, the highly amorphous, large grain tin film used as the storage element in cryogenic continuous sheet random access memories may also be formed by the electroless substitution reactions.

Thus an important object of the present invention is to provide a more simplified process for producing improved cryogenic devices.

Another object of the invention is to provide such a process wherein the number of vacuum vapor deposition steps is substantially reduced or eliminated.

Another object of the invention is to provide a process for increasing device yield by decreasing the likelihood of surface contamination affecting superconductivity.

Yet another object is to provide a cryotron structure having "cleaner" transmission line configuration which can be operated at higher frequencies.

A further object of the invention is to provide a process for fabricating cryogenic circuits less subject to insulation breakdown.

Another object of the invention is to provide increased component density by reason of the simplified and less "angular" nature of the structure.

Additional aspects, objects and advantages of this invention will be evident to those skilled in the art from the following detailed description and drawings, wherein.

Figures 1, 2:
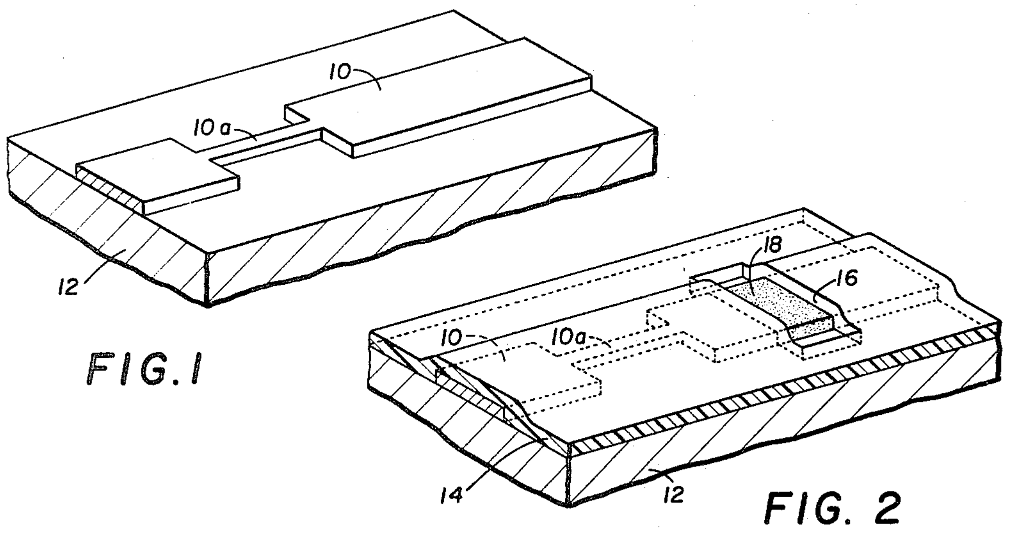
FIGURES 1, 2 and 3 are schematic drawings illustrating steps of the process of the present invention.

In accordance with the broader aspects of this invention, a first, thin metal film is formed on a substrate by any suitable process for preparing films of the desired minimum thickness and required quality. Then the areas on the substrate where it is desired to form a thin film of a second metal are exposed to a suitable solution containing ions of the second metal which then replaces substantially all of the first metal. In general, any solution customarily used for electroless plating of the second metal on the first may be employed, and in some cases solutions used in electroplating of the second metal on the first may be employed, since substantially all electroless and many electroplating reactions result in the replacement of the first thin layer of the plated metal with the plating metal. However, in almost all cases the electroless process will be preferred because incoherent patterns may be processed without making electrical contact with each individual patch of the previously patterned metal film which is to be partially replaced. By reason of the chemical reaction between the solution and the metal of the thin film, the second metal is caused to replace all or substantially all of the first metal so that a thin film of the second metal is formed coplanar with the original thin film of the first metal. As used herein, the term "thin film" refers generally to films of less than 5,000 angstroms in thickness, but the thickness of the film which may be replaced will vary with the particular solution and process parameters. This permits the formation of a film of the second metal by a simple chemical process on a substrate upon which the second metal could not otherwise be deposited except by vapor deposition. But more importantly, the resulting film and the edge-to-edge junction between the second metal and the first metal is electrically coherent and superconductive, and is substantially equal in this respect to junctions obtained by vapor depositing the second metal on the first metal. Further, in some instances where contamination of the surface of the first metal film presents a problem, as when depositing lead on tin or tin on lead, the superconductivity of the junction may be superior because the electroless substitution process can be carried out through surfaces contaminated with oxides and residues.

In accordance with a specific aspect of the invention, a thin film of tin, up to several thousand angstroms in thickness, can be electrolessly substituted for a similarly thin lead film by subjecting the lead film to an acidic solution containing a soluble stannous compound. More specifically, the stannous compound may comprise a stannous halide, and preferably comprises stannous chloride or stannous bromide. For example, one process which is known in the art to be useful as an electroless process for plating tin on lead comprises subjecting the lead to a solution comprised of 25 grams of stannous chloride and 50 milliliters of hydrochloric acid in one liter of water. The particular degree of acidity, or the particular concentration of the stannous compound does not appear to be critical insofar as the carrying out of the process is concerned, although optimum conditions no doubt exist. In general, a saturated solution is desirable and the rate of substitution can, in general, be increased by raising the temperature of the solution. Temperatures from about 50° C. to about 80° C. have been successfully used.

Commercially available salts distributed by the Shipley Company under the trademark Cuposit LT–26 for electrolessly plating tin on copper may be mixed, as suggested by Shipley, and used to electrolessly substitute tin for lead in accordance with the present invention. Although the specific ingredients of the LT–26 salts are not known, it is known that the salts are primarily comprised of stannous chloride with some added quantity of thiourea $[(NH_3)_2CS]$ A one liter solution is obtained by mixing 50 milliliters of concentrated hydrochloric acid and 150 grams of the salts with a sufficient volume of water to produce one liter.

In accordance with another specific aspect of the invention, a thin film of copper may be chemically replaced by a thin film of tin using the same solutions described above, and in particular, by using the Cuposit LT-26 salts and the formula specified by the manufacturer for plating tin on copper. During the electroless plating process, the tin actually replaces the copper for the first several thousand angstroms of thickness so that if the copper is initially only a few thousand angstroms in thickness, the entire copper film may be replaced by tin. The solution for electrolessly substituting tin for copper is substantially the same as that for electrolessly substituting tin for lead, except that thiourea is preferably added to act as a buffer and to speed the chemical reaction.

In accordance with another aspect of the invention, a thin film of copper may be chemically replaced by a thin film of lead by immersing the copper in a solution of a soluble lead salt and a suitable reducing agent. A typical solution for this purpose is formed by dissolving approximately 35 grams of lead nitrate and 35 grams of thiourea in 175 milliliters of dimethylsulfoxide (DMSO). The thin copper film is then exposed to the solution in the areas where it is desired to replace the copper film with a lead film. The temperature and reagent concentration of the solution are not particularly critical parameters in carrying out the process, although a temperature of about 50° C. is preferred. Although solvents such as water, tetrahydrofuran and others may be used in the solution, dimethylsulfoxide has been found to provide superior quality of deposit and speed of deposition.

Using the above electroless chemical substitution processes, thin film circuits in general, and cryogenic circuits in particular, may be fabricated using the fabrication processes illustrated in the drawings.

Figure 3:
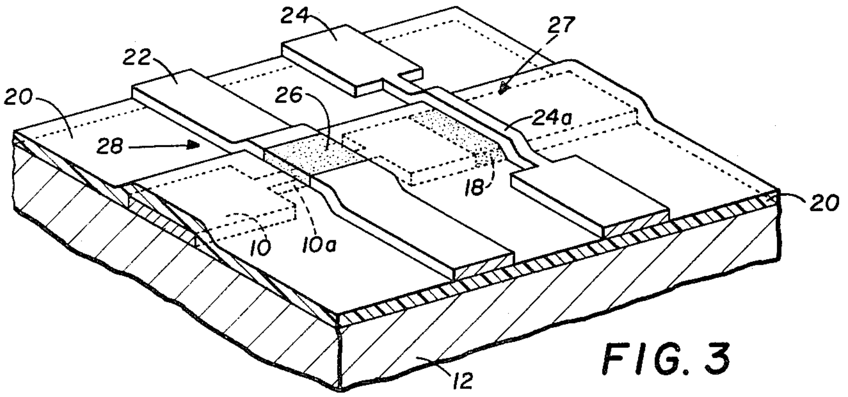

Referring now to FIGURES 1–3, a thin film lead strip conductor 10 is formed on a suitable substrate 12 which may comprise other layers of a multilayer circuit as well as a glass substrate. The lead strip 10, being less than about 10,000 angstroms in thickness, may conveniently be about 6,000 or 8,000 angstroms in thickness. The lead strip 10 may be formed by any suitable conventional technique. For example, a lead film may be deposited over the entire surface of the substrate 12 by first positioning the substrate in a vacuum chamber and then evaporating lead onto the substrate surface. Or, for further example, a thin film of copper may first be formed over the surface of the substrate by a conventional chemical deposition technique and the lead film then electrolessly substituted for the copper by the chemical process described above. A layer of conventional photo-resist material, such as KPR or AZ–17, is then applied over the lead film, exposed through a suitable photomask, and developed to remove the photo-resist in all areas where the lead film is to be removed thereby leaving the conductor strip 10. The substrate is then immersed in a suitable selective etchant, such as dilute nitric acid, which attacks the lead film where unprotected by the photo-resist. The layer of photo-resist is then stripped away by a conventional stripping solution so that the lead strip 10 remains exposed on the surface of the substrate 12.

After the lead strip 10 is formed, a second photo-resist film 14 is applied over the lead strip 10, as illustrated in FIGURE 2. An aperture 16 is opened by exposure and development in the photo-resist layer over an area of the lead strip 10 which is to become a tin gate for a cryotron. The aperture 16 is formed so as to insure that the entire transverse width of the lead strip 10 will be subject to the chemical substitution solution. The substrate is then immersed in the chemical solution for electrolessly substituting tin for lead. The area of the lead strip 10 exposed by the aperture 16 will then be substantially replaced by a tin film 18 represented by the stippled area for convenience of illustration.

The photomask layer 14 is then stripped away and an insulating layer 20 formed over the conductor 10, as illustrated in FIGURE 3. The insulating layer 20 may comprise any suitable insulating material, but preferably comprises another layer of photo-resist material suitably cured as by bombardment with ions as described in copending U.S. application Ser. No. 415,845, entitled "Process for Making Thin Film Circuit Devices," filed by Pierce and Pritchard on Nov. 16, 1964, and assigned to the assignee of the present invention.

The process described above is then repeated to form lead strips 22 and 24 which are superimposed over the lead strip 10 and electrically insulated from the strip 10 by the insulation layer 20. A second tin gate 26 is then formed in the lead strip 22 by electrolessly substituting tin for the lead using the process above described for the formation of tin gate 18.

A portion of a typical cryogenic circuit has thus been fabricated in two layers. One cryotron is indicated generally by the reference numeral 27 and is comprised of the tin gate 18 in the lead carrier conductor 10 and the necked control portion **24*a* of the lead conductor 24. Current through the control conductor 24*a* switches the tin gate 18 from superconductivity to normal resistivity. Thus the cryotron 27 can be used to control the superconductivity of the lead carrier conductor 10, or conversely, the resistivity of the lead carrier conductor 10 is an indication of the presence or absence of current in the lead control conductor 24*a*. Similarly, a cryotron indicated generally by the reference numeral 28 is comprised of a tin gate 26 in the lead carrier conductor 22, and the necked portion 10*a* of the lead conductor strip 10** which is the control conductor.

It will be noted from FIGURE 3 that the tin gates 18 and 26 occur in different planes and that the control conductors **24*a* and 10*a* are disposed on opposite sides of the tin gates. In most cryogenic circuits, particularly when high component density is desired, it is necessary to sandwich the tin gates 18 and 26 between the respective control conductors 24*a* and 10*a* and a superconductive ground plane, such as a continuous lead sheet, the gates being of course electrically insulated from both the control conductors and the ground plane. Since the control conductors 24*a* and 10*a* are disposed on opposite sides of the tin gates 18 and 26**, a single ground plane for the construction illustrated in FIGURE 3 is inadequate. However, in accordance with another aspect of the invention, ground planes may be provided for the cryotron structure as illustrated in FIGURE 4.

Figure 4:
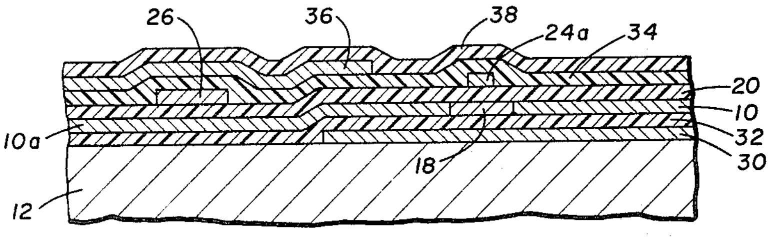
FIGURE 4 is a sectional view of a portion of a typical cryogenic circuit illustrating two cryotrons fabricated by the process described in relation to FIGURES 1–3.

In FIGURE 4, a lead ground plane 30 is first formed on the substrate 12 under the tin gate 18. An insulating layer 32 is then formed over the ground plane 30 and the lead conductor 10 and gate 18 are formed on the insulating layer 32. Then the insulating layer 20 and the lead conductors 22 and 24 are formed in succession and the tin gate 26 substituted for the lead as described above. Another insulating layer 34 is then formed over the conductors 22 and 24 and over gate 26, and a second lead ground plane 36 is formed over the tin gate 26. A final insulating layer 38 may be formed over the ground plane 36 and the remainder of the structure as desired. Of course, it will be appreciated that in actual fabrication of cryogenic circuits, a greater number of different layers and steps may be required in order to fabricate the circuit, and substantially any number of layers as illustrated in FIGURE 4 may be used with appropriate openings left in the various insulating layers to permit contact to be made between successively deposited metal layers. From FIGURE 4 it will be noted that each of the tin gates 18 and 26 is sandwiched between a ground plane and the respective control conductors **24*a* and 10*a***. The ground planes may be electrically interconnected through the successive insulating layers if desired, or may be interconnected at the extremity of the planes.

Figures 5, 6:
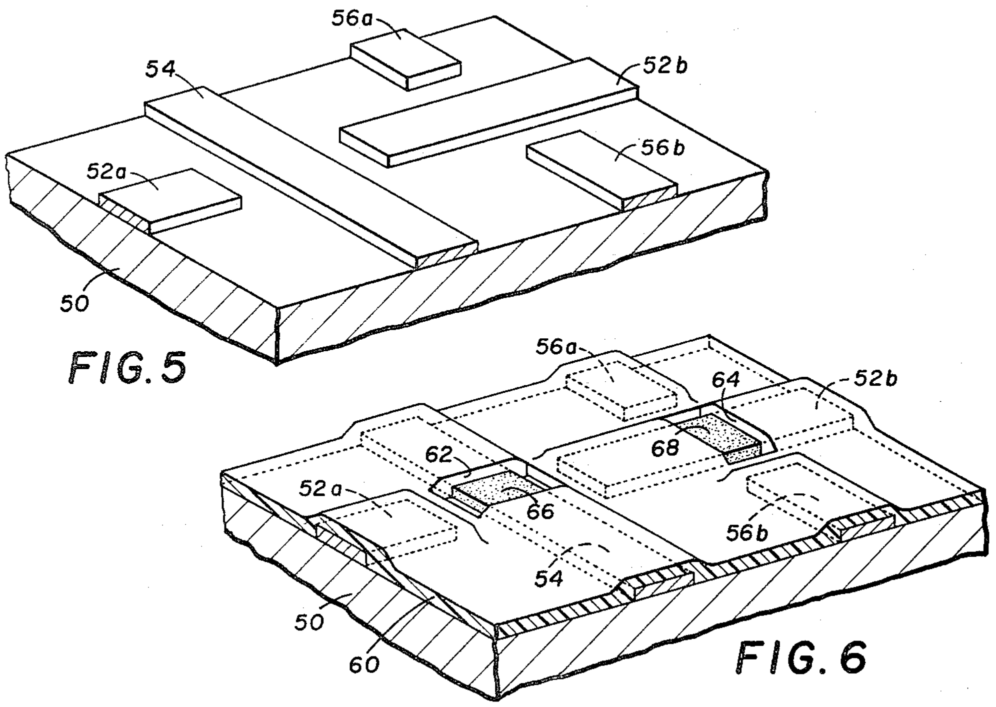
FIGURES 5, 6, 7 and 8 are schematic drawings illustrating the steps of an alternative process in accordance with the present invention.

An alternative process for fabricating an equivalent cryogenic circuit to that illustrated in FIGURE 3 is illustrated in FIGURES 5–8. In this process, as shown in FIGURE 5, a lead film is first deposited over the substrate 50, either by vapor deposition or by substitution for a previously deposited copper film, and is patterned to form conductor strips 52*a* and 52*b*, 54, and 56*a* and 56*b*. In the event the previously formed copper film is electrolessly replaced by lead, either the copper or the lead may be patterned by using photo-resist techniques. Next, as shown in FIGURE 6, a layer of photo-resist material 60 is formed over the substrate, is patterned by exposure through a photo-mask, and is developed to form apertures 62 and 64 over areas of the lead conductor strips 54 and 52*b*, respectively, where it is desired to insert a tin gate to form a cryotron. The substrate is then immersed in the chemical substitution solution so that the exposed areas of the lead conductor strips 54 and 52 will be replaced by tin gates 66 and 68, which are stippled for convenience of illustration.

Figures 7, 8:
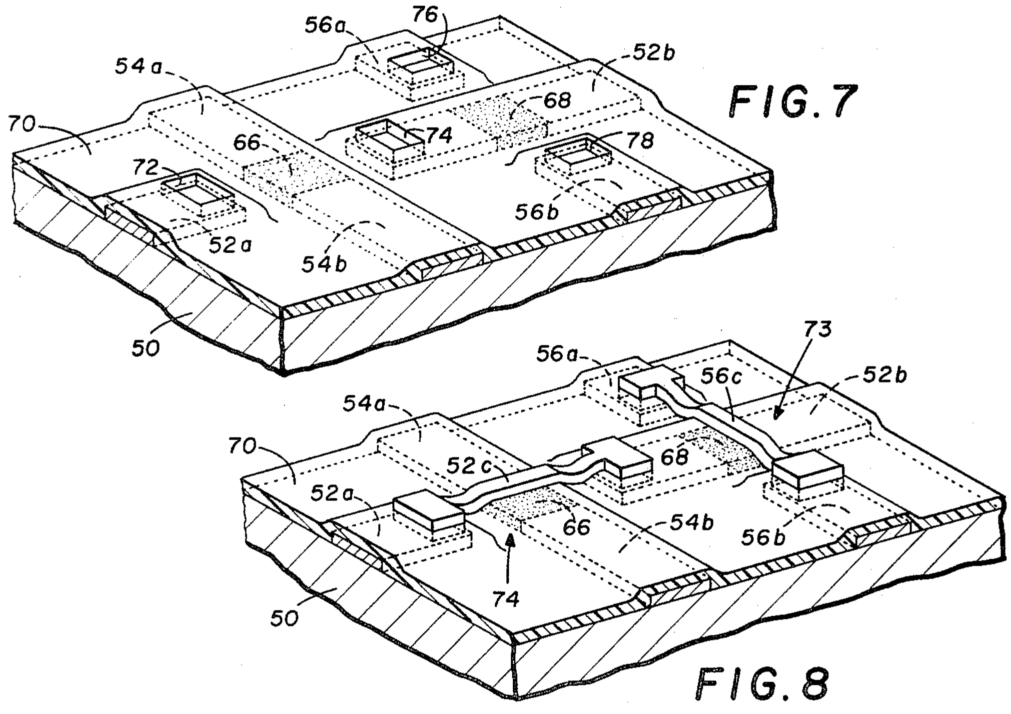

The photo-resist layer 60 is then stripped and, as shown in FIGURE 7, an insulating layer 70 deposited over the various conductors. Tab-through apertures 72 and 74 are formed over the adjacent ends of the lead conductors 52*a* and 52*b*, respectively, and apertures 76 and 78 are formed over the adjacent ends of the lead conductors 56*a* and 56*b*. This can readily be accomplished if the insulating layer 70 is photo-resist material which is cured after patterning, or can be accomplished by photo-resist and etching techniques in the event the insulating layer 70 is some other more conventional material.

Next, as shown in FIGURE 8, a lead film is formed over the insulating layer 70 by such means as evaporation or by chemical substitution of lead for a copper film, and the lead film patterned to produce jumper control strips 52*c* and 56*c* which pass through the apertures 72 and 74, and 76 and 78, respectively, to contact the lead conductors 52*a*–52*b* and 56*a*–56*b* and complete the circuit. Thus, a cryotron indicated generally by the reference numeral 73 is formed which is comprised of the tin gate 68 and the lead control strip 56*c*, and a cryotron indicated generally by the reference numeral 74 is comprised of the tin gate 66 and the control strip 52*c*.

Figure 9:
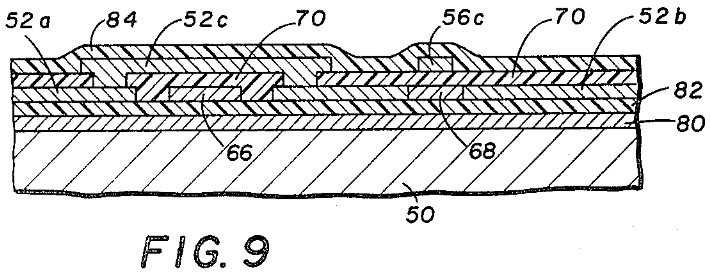
FIGURE 9 is a sectional view of a cryogenic circuit illustrating a typical cryogenic circuit fabricated in accordance with the process illustrated in relation to FIGURES 5–8.

It will be noted that the control strips 52*c* and 56*c* are on the same side of the respective tin gates 66 and 68. This permits a cryogenic circuit device to be constructed, such as illustrated in FIGURE 9, wherein a single superconductive lead ground plane 80 suffices for both cryotrons. In the fabrication of the device of FIGURE 9, the lead ground plane 80 is deposited on the substrate under the areas of the tin gates 66 and 68 and covered by an insulating layer 82. The lead conductors 52*a*, 52*b*, 54*a*, 54*b*, 56*a*, and 56*b* and tin gates 66 and 68 in respective conductors 54*b* and 52*b* are formed over the insulating layer 82. The insulating layer 70 and the control conductors 52*c* and 56*c* are then formed. A final insulating layer 84 may be provided to cover the entire structure, or provide the base for additional circuitry, if required. Although the device of FIGURE 9 requires interconnection between two successive conducting layers through apertures in an insulating layer, it will be appreciated that the contact is between two lead films, rather than between lead and tin, so that the problems of obtaining a superconductive junction are minimized.

Figure 10:
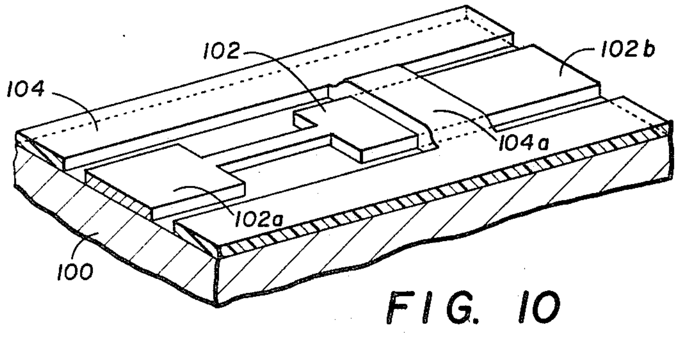
FIGURES 10 and 11 are schematic drawings illustrating the steps of another process in accordance with the present invention.
Figure 11:
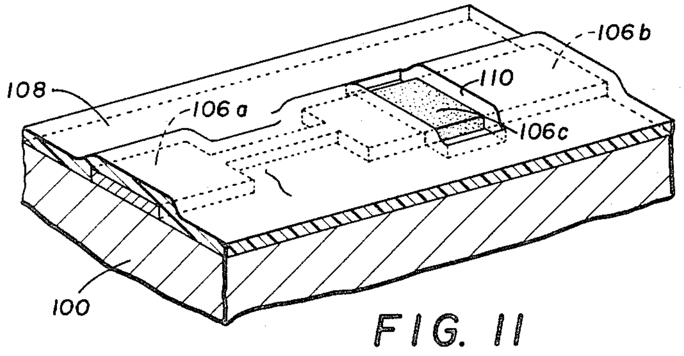

In accordance with another aspect of the invention, a cryogenic circuit device is formed by first depositing a thin film of copper over the surface of a substrate 100 (see FIGURES 10 and 11) by any suitable deposition technique, preferably by a chemical deposition process of which many are known in the art. The copper film is then patterned by conventional photo-resist and etching techniques to form a thin film copper strip 102. A photo-resist layer 104 is then formed over the substrate 100 and the copper strip 102 and removed in predetermined areas to expose the areas of the copper film 102 where it is desired to substitute lead and protect the areas where tin is ultimately to be substituted. For example, the portions 102*a* and 102*b* are exposed, and the area where a tin gate is to be formed is protected by a strip of photo-resist 104*a*. The substrate is then subjected to the solution described above for substituting lead for copper such that lead conductor strips 106*a* and 106*b* will be formed. The photo-resist film 104 is then stripped from the substrate and a second photo-resist layer 108 formed over the substrate and patterned to form an aperture 110 over that portion of the conductor strip which is still copper. It is desirable to form the aperture 110 slightly wider than the remaining copper so as to insure that all the copper will be replaced. Then the substrate is immersed in the solution for substituting tin for copper, which as previously noted may be the same solution used to substitute tin for lead. Tin is then substituted for the remaining copper to form the tin gate portion 106*c*. Since the solution also substitutes tin for lead, the danger of any copper remaining in the junction to affect superconductivity is minimized. Thus it will be noted that the resulting conductor 106 is identical to the conductor 10 and tin gate 18, as in FIGURE 2. The process may be repeated to form the conductors of subsequent layers and the circuit devices as illustrated in FIGURES 4 or 9.

Figure 12:
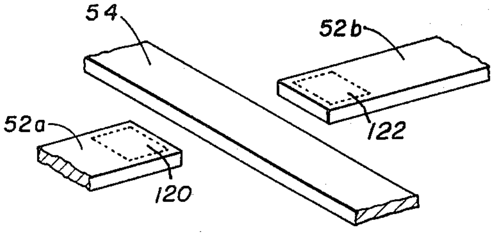
FIGURE 12 is a schematic drawing illustrating another aspect of the process of the present invention.

In accordance with another aspect of the invention, contact between an existing metal layer and subsequently deposited metal film can be made through an aperture in an insulating layer without any special cleaning of the previous metal layer by the following process. For example, when fabricating the circuit illustrated in FIGURE 9, the conductors 52*a*, 52*b*, and 54 (see FIGURE 12) may be formed by first depositing a thin film of copper over the substrate and patterning the copper. Lead is then substituted for the copper except in the areas 120 and 122 which are located where the apertures 72 and 74 of FIGURE 7 will be. Then after the tin gates have been formed by substituting tin for lead (or copper), and after the insulating layer 70 has been formed and the apertures 72 and 74 opened, another thin film of copper is formed over the insulating layer 70 so as to pass through the apertures 72 and 74 and contact the remaining copper areas 120 and 122. The copper film may be patterned to form the jumpers 52*c* and 56*c* of FIGURE 8. Then the substrate may be immersed in the solution for substituting lead for copper. If the total thickness of the copper film forming the area 120 or 122 plus the subsequently deposited copper film does not exceed the penetration depth of the substitution solution, the substituted lead will then replace both the last deposited copper film and the previously deposited copper film remaining in the areas 120 and 122. The chemical reaction of substituting the lead for the copper will penetrate through even an oxidized and residue contaminated surface between the two copper layers so that the ultimate lead to lead contact between the jumper conductor 52*c* and the conductors 52*a* and 52*b* will be superconductive.

In general, it is preferred to pattern the first metal film that is formed prior to the substitution of a second metal so that the different etch rates of the metals will not present any problems. However, it will be appreciated that the second metal can be substituted for predetermined areas of the first deposited metal film prior to patterning if found more convenient. Thus the cryogenic circuits may be formed by first depositing a lead film, patterning the lead film to form the lead conductive strips, and then substituting tin for predetermined areas of the lead pattern to form the tin gates. Or a lead film may be deposited, tin substituted for predetermined areas of the lead film, and then the composite lead and tin film patterned to produce the desired lead conductors and tin gates. Or a thin film of copper may be deposited and patterned into the desired configuration for the lead conductor strips and tin gates, then lead substituted for the copper in the areas of the pattern which are to be lead conductors, and tin substituted for the copper in the areas of the pattern which are to be tin gates. Also, a copper film may be deposited, lead substituted for the entire copper film, the lead film patterned, and, finally, tin substituted for predetermined portions of the patterned lead conductors to form the tin gates. Or the copper film can first be patterned, then lead substituted for the entire copper pattern, and finally tin substituted for predetermined areas of the lead pattern. Or a thin film of copper may be formed, the entire film replaced by lead, predetermined areas of the lead film replaced by tin, and then the entire film patterned. Also, a copper film may be replaced in predetermined areas by lead, and in the remaining areas by tin, and then the composite lead and tin film patterned. Thus it will be appreciated that considerable flexibility is provided.

From the above description of the present invention, it will be seen that in general a thin film of a first metal may be chemically replaced by a thin film of a second metal. In the fabrication of cryogenic circuits in general, and cryotrons in particular, wherein the controlling factor is the critical current level of the metal in a particular location, it will be appreciated that the absolute replacement of all of one metal by another metal is not necessarily essential so long as the superconductive characteristics of the resulting metal are at useful levels. Thus, where tin replaces lead, it is necessary only that sufficient tin replace the lead as to lower the critical current level of the gate region to the desired extent, approximately that of tin. In areas where lead replaces copper, it is necessary only that enough of the copper be replaced that the critical current of that region will approach that of lead.

The process for forming a tin film by substituting tin for a previously deposited lead or copper film results in a continuous, amorphous layer of tin having large grain structure which is suitable for use as the storage means in a cryoelectric, continuous sheet, random access memory. The memory sheet of such a system requires relatively large grain for trapping current in the manner well known in the art and described in the literature.

From the above description of preferred embodiments of the invention, it will be noted that a system for fabricating cryogenic circuits has been described which substantially reduces or eliminates the requirement for vacuum deposition equipment. Further, the problems associated with cleaning surfaces between sequentially deposited contacting films are eliminated, or substantially reduced, and contact between subsequently deposited films of different types of metals, such as lead and tin, are eliminated. The resulting structure includes a tin gate coplanar with a lead conductor, and the joints between the lead and tin are superconductive. The location of tin gates coplanar with the lead conductors results in cleaner transmission lines so that the circuit configuration is simplified and the speed of the circuit increased.

Although preferred embodiments of the invention have been described in detail, it is to be understood that various changes, substitutions and alterations can be made therein without departing from the spirit and scope of the invention as defined by the appended claims.

What is claimed is:

1. The process for producing a thin film electrical conductor including tin (Sn) and lead (Pb) sections connected in series which comprises:

depositing a thin film of lead (Pb) on a substrate, protecting said lead (Pb) film in the areas to be retained as lead (Pb) by a layer of photo-resist material, and subjecting only the areas of the lead (Pb) which are not protected by said photo-resist material to an acidic stannous solution to substitute tin (Sn) for the lead (Pb) in said sections.

2. The process for producing a thin film superconductive strip of lead (Pb) having a tin (Sn) gate therein for forming a cryogenic device which comprises:

forming a thin film of lead (Pb) on a substrate, and substituting tin (Sn) for the lead (Pb) in predetermined areas of said lead film by immersing the said areas in an acidic solution of a soluble stannous salt taken from the group consisting of stannous chloride and stannous bromide.

3. The process for producing a thin film superconductive strip of lead (Pb) having a tin (Sn) gate therein for forming a cryogenic device which comprises:

depositing a thin film of copper (Cu) on a substrate, chemically substituting lead (Pb) for the copper (Cu) in predetermined areas by immersing the copper (Cu) in a reducing solution of a soluble lead salt, and chemically substituting tin (Sn) for copper (Cu) in other predetermined areas by immersing the copper (Cu) in an acidic solution of a soluble stannous compound.

4. The process for producing a thin film superconductive strip of lead (Pb) having a tin (Sn) gate therein for forming a cryogenic device which comprises:

depositing a thin film of copper (Cu) on an insulating substrate, chemically substituting lead (Pb) for the copper (Cu) by immersing the copper (Cu) in a reducing solution containing thiourea and a soluble lead (Pb) salt to form a thin lead (Pb) film, and chemically substituting tin (Sn) for the lead (Pb) in predetermined areas by immersing said predetermined areas of the lead (Pb) in an acidic stannous solution.

References Cited

UNITED STATES PATENTS

| | | | |
|---|---|---|---|
| 3,075,866 | 1/1963 | Baker | 117—212 |
| 2,282,511 | 5/1942 | Bradley | 117—130 |
| 2,369,620 | 2/1945 | Sullivan et al. | 117—130 |
| 2,543,365 | 2/1951 | Harris | 117—130 X |
| 2,662,831 | 12/1953 | Culverhouse | 117—130 X |
| 2,951,768 | 9/1960 | Brash | 117—130 X |
| 3,305,389 | 2/1967 | Lowenheim et al. | 117—130 |
| 3,323,938 | 6/1967 | Vaught | 117—130 X |

OTHER REFERENCES

Porter: A Survey of Organic Solvents for the Electrodeposition of Plutonium, AEC DP 389, July 1959, p. 4.

Schlafer et al.: Angew. Chem., vol. 72, p. 622 (1960).

RALPH S. KENDALL, *Primary Examiner.*